(12) United States Patent
Chen (10) Patent No.: US 11,978,637 B2
(45) Date of Patent: May 7, 2024

(54) MANUFACTURING METHOD FOR SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Enhao Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 409 days.

(21) Appl. No.: 17/439,002

(22) PCT Filed: May 24, 2021

(86) PCT No.: PCT/CN2021/095412
§ 371 (c)(1),
(2) Date: Sep. 14, 2021

(87) PCT Pub. No.: WO2022/100055
PCT Pub. Date: May 19, 2022

(65) Prior Publication Data
US 2023/0057460 A1 Feb. 23, 2023

(30) Foreign Application Priority Data
Nov. 11, 2020 (CN) .......................... 202011254219.6

(51) Int. Cl.
*H01L 21/308* (2006.01)
(52) U.S. Cl.
CPC ................................ *H01L 21/3086* (2013.01)

(58) Field of Classification Search
CPC ............. H01L 21/0332; H01L 21/0334; H01L 21/0335; H01L 21/0337; H01L 21/0338
See application file for complete search history.

(56) References Cited

U.S. PATENT DOCUMENTS

| 6,605,541 B1 | 8/2003 | Yu |
| 7,361,453 B2 | 4/2008 | Verheijden et al. |
| (Continued) | | |

FOREIGN PATENT DOCUMENTS

| CN | 1681084 A | 10/2005 |
| CN | 101221890 A | 7/2008 |
| (Continued) | | |

OTHER PUBLICATIONS

International Search Report cited in PCT/CN2021/095412 mailed Aug. 23, 2021, 9 pages.

*Primary Examiner* — Walter H Swanson
(74) *Attorney, Agent, or Firm* — Cooper Legal Group, LLC (57) ABSTRACT

The present disclosure provides a manufacturing method for semiconductor structure and a semiconductor structure. The manufacturing method includes: providing a substrate; forming first mask patterns and first mask openings on the substrate, the first mask opening being located between the adjacent first mask patterns; forming second mask patterns and second mask openings on the first mask patterns and the first mask openings, the second mask opening being located between the adjacent second mask patterns; and forming first patterns and first openings on the substrate based on the first mask patterns, the first mask openings, the second mask patterns and the second mask openings.

17 Claims, 6 Drawing Sheets

(56) References Cited

U.S. PATENT DOCUMENTS

| | | | |
|---|---|---|---|
| 2005/0214690 A1* | 9/2005 | Verheijden | H01L 21/31144 |
| | | | 257/E21.038 |
| 2007/0092829 A1 | 4/2007 | Noelscher et al. | |
| 2016/0181115 A1* | 6/2016 | deVilliers | H01L 21/32139 |
| | | | 438/695 |

FOREIGN PATENT DOCUMENTS

| | | | |
|---|---|---|---|
| CN | 102129968 A | 7/2011 | |
| CN | 102478764 A | 5/2012 | |
| CN | 103367120 A | 10/2013 | |
| CN | 110824847 A | 2/2020 | |
| TW | 200717180 A | 5/2007 | |

* cited by examiner

MANUFACTURING METHOD FOR SEMICONDUCTOR STRUCTURE AND SEMICONDUCTOR STRUCTURE

CROSS-REFERENCE TO RELATED APPLICATIONS

The present application claims the priority to Chinese Patent Application 202011254219.6, titled "Manufacturing method for semiconductor structure", filed to China National Intellectual Property Administration on Nov. 11, 2020, which is incorporated herein by reference in its entirety.

TECHNICAL FIELD

The present disclosure relates to, but is not limited to, a manufacturing method for semiconductor structure and a semiconductor structure.

BACKGROUND

In the semiconductor industry, reducing the size of devices and increasing the number of devices within a certain area is the future development direction. At present, the methods for stepwise reduction of line width in the semiconductor imaging process mainly include self-aligned double patterning (SADP) and self-aligned quadruple patterning (SAQP). For smaller devices and more chips, the key line width has always been the bottleneck restricting the next generation of semiconductors.

SUMMARY

The following is a summary of the subject matter detailed herein. This summary is not intended to limit the protection scope defined by the claims.

An embodiment of the present disclosure provides a manufacturing method for semiconductor structure, comprising: providing a substrate; forming first mask patterns and first mask openings on the substrate, the first mask opening being located between the adjacent first mask patterns; forming second mask patterns and second mask openings on the first mask patterns and the first mask openings, the second mask opening being located between the adjacent second mask patterns, wherein the projection of the second mask patterns on the substrate is at least partially overlapped with the projection of the first mask patterns and the first mask openings on the substrate, and the projection of the second mask openings on the substrate is at least partially overlapped with the projection of the first mask patterns and the first mask openings on the substrate; and forming first patterns and first openings on the substrate based on the first mask patterns, the first mask openings, the second mask patterns and the second mask openings.

An embodiment of the present disclosure provides a semiconductor structure formed according to the manufacturing method for semiconductor structure of the present disclosure.

After reading and understanding the drawings and detailed description, other aspects may be understood.

BRIEF DESCRIPTION OF THE DRAWINGS

The accompanying drawings, which are incorporated in and form a part of this specification, illustrate embodiments of the present disclosure and explain, together with the description, the principles of the present disclosure. In these drawings, like reference numerals identify like elements. The drawings to be described below are some, but not all, embodiments of the present disclosure. Other drawings may be obtained by a person of ordinary skill in the art in accordance with those drawings without paying any creative effort.

DETAILED DESCRIPTION

To make the purposes, technical solutions and advantages of the embodiments of the present disclosure clearer, the technical solutions in the embodiments of the present disclosure will be described clearly and completely with reference to the drawings in the embodiments of the present disclosure. Apparently, the embodiments to be described are some, but not all, embodiments of the present disclosure. Based on the embodiments of the present disclosure, all other embodiments obtained by a person of ordinary skill in the art without paying any creative effort should be included in the protection scope of the present disclosure. It is to be noted that the embodiments of the present disclosure and features in the embodiments may be combined if not conflict.

Hereinafter, a manufacturing method for semiconductor structure according to the present disclosure will be described with reference to the accompanying drawings by specific implementations.

Figure 1:
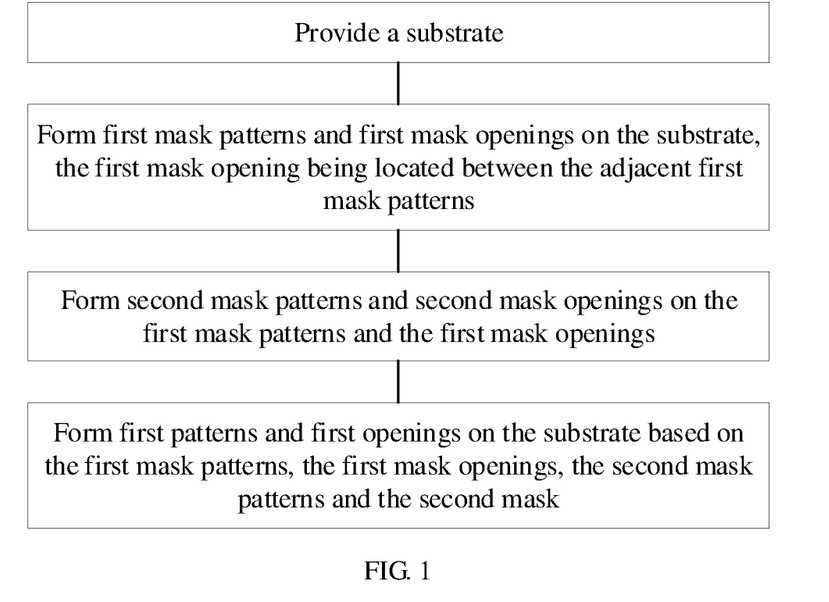
FIG. 1 is a flowchart of a manufacturing method for semiconductor structure according to an embodiment of the present disclosure.

As shown in FIG. 1, the present disclosure provides a manufacturing method for semiconductor structure, comprising: providing a substrate 1; forming first mask patterns 21 and first mask openings 22 on the substrate 1, the first mask opening 22 being located between the adjacent first mask patterns 21; forming second mask patterns 41 and second mask openings 42 on the first mask patterns 21 and the first mask openings 22, the second mask opening 42 being located between the adjacent second mask patterns 41, wherein the projection of the second mask patterns 41 on the substrate 1 is at least partially overlapped with the projection of the first mask patterns 21 and the first mask openings 22 on the substrate 1, and the projection of the second mask openings 42 on the substrate 1 is at least partially overlapped with the projection of the first mask patterns 21 and the first mask openings 22 on the substrate 1; and forming first patterns 11 and first openings 12 on the substrate 1 based on the first mask patterns 21, the first mask openings 22, the second mask patterns 41 and the second mask openings 42.

FIGS. 2-13 are cross-sectional views of the structures formed in steps of the manufacturing method for semiconductor structure according to an embodiment of the present disclosure.

Figure 2:
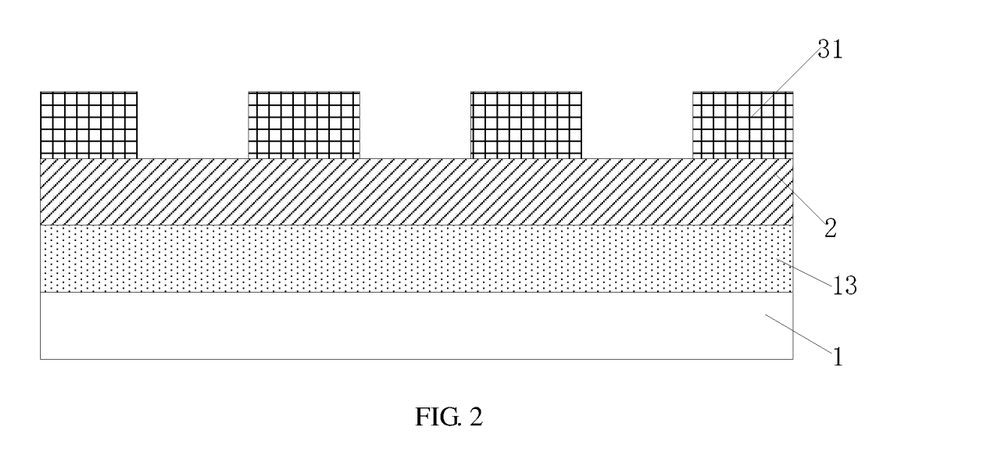
FIGS. 2-14 are cross-sectional views of the structures formed in steps of the manufacturing method for semiconductor structure according to an embodiment of the present disclosure.
Figure 3:
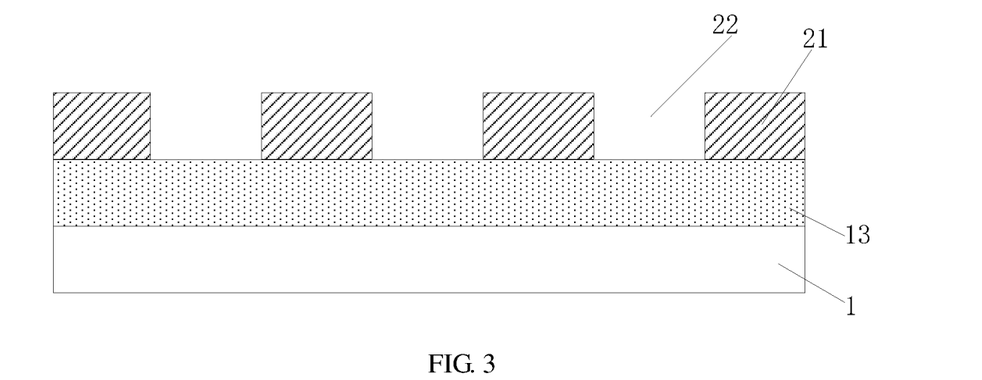

As shown in FIG. 2, a substrate 1 is provided. The substrate 1 may be made of silicon (Si), germanium (Ge), silicon germanium (GeSi), or silicon carbide (SiC); it may be made of silicon-on-insulator (SOI), germanium-on-insulator (GOI); or it may be made of other materials, for example group III-V compounds such as gallium arsenide. Devices may be arranged on the substrate 1. A first mask pattern layer 2 and a patterned first photoresist layer 31 are sequentially formed on the substrate 1. Specifically, the patterned first photoresist layer 31 may be formed by exposure and development by using a first reticle. As shown in FIG. 3, the first mask pattern layer 2 is etched using the patterned first photoresist layer 31 as a mask, to transfer the pattern to the first mask pattern layer 2. Specifically, dry etching, wet etching, etc., may be used. By etching the first mask pattern layer 2, first mask patterns 21 and first mask openings 22 are formed. The first mask opening 22 is located between the adjacent first mask patterns 21. Then, the first photoresist layer 31 is removed.

Optionally, a first mask layer 13 is further formed on the substrate 1. The first mask layer 13 may be a silicon oxide, silicon nitride, or organic carbon layer. The first mask pattern layer 2 and the patterned first photoresist layer 31 are sequentially formed on the first mask layer 13.

Figure 4:
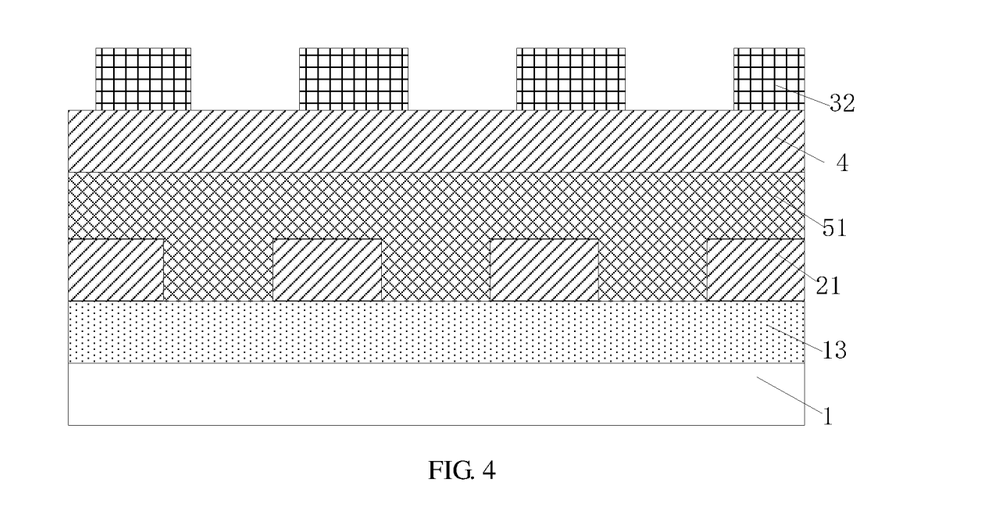
Figure 5:
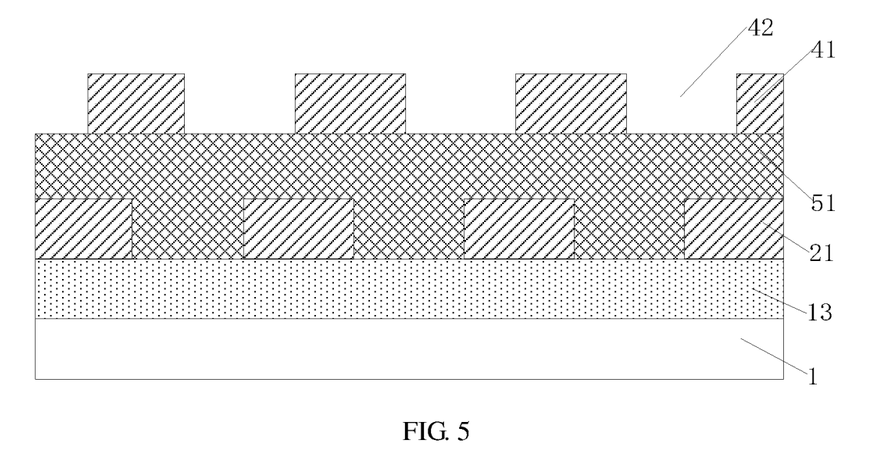

As shown in FIGS. 4-5, a first dielectric layer 51 is formed above the first mask patterns 21 and the first mask openings 22 to form second mask patterns 41 and second mask openings 42 on the first dielectric layer 51.

As shown in FIG. 4, a second mask pattern layer 4 is formed on the first dielectric layer 51, and a patterned second photoresist layer 32 is formed on the second mask pattern layer 4. The second mask pattern layer 4 is etched using the patterned second photoresist layer 32 as a mask, to transfer the pattern to the second mask pattern layer 4. Specifically, dry etching, wet etching, etc., may be used. By etching the second mask pattern layer 4, second mask patterns 41 and second mask openings 42 are formed. The second mask opening 42 is located between the adjacent second mask patterns 41. Then, the second photoresist layer 32 is removed.

As shown in FIG. 5, second mask patterns 41 and second mask openings 42 are formed on the first mask patterns 21 and the first mask openings 22, the second mask opening 42 being located between the adjacent second mask patterns 41, wherein the projection of the second mask patterns 41 on the substrate 1 is at least partially overlapped with the projection of the first mask patterns 21 and the first mask openings 22 on the substrate 1, and the projection of the second mask openings 42 on the substrate 1 is at least partially overlapped with the projection of the first mask patterns 21 and the first mask openings 22 on the substrate 1.

Optionally, the first mask patterns 21, the first mask openings 22, the second mask patterns 41, and the second mask openings 42 may be formed by using a same photomask. Specifically, a patterned second photoresist layer 32 may be formed by exposure and development by using a first reticle. In this way, the width of the first mask patterns 21 is the same as the width of the second mask patterns 41, and the width of the first mask openings 22 is the same as the width of the second mask openings 42. The first mask patterns 21 and the first mask openings 22 are not completely overlapped with the second mask patterns 41 and the second mask openings 42. That is, the projection of the second mask patterns 41 on the substrate 1 is at least partially overlapped with the projection of the first mask patterns 21 and the first mask openings 22 on the substrate 1, and the projection of the second mask openings 42 on the substrate 1 is at least partially overlapped with the projection of the first mask patterns 21 and the first mask openings 22 on the substrate 1. The overlapped area of the second mask patterns 41 and the first mask patterns 21 or the width of them may be set according to actual needs. The use of a same photomask saves the cost, and also facilitates the accurate control on the size of the overlapped part of the second mask patterns 41 and the second mask openings 42 with the first mask patterns 21 and the first mask openings 22.

Figure 6:
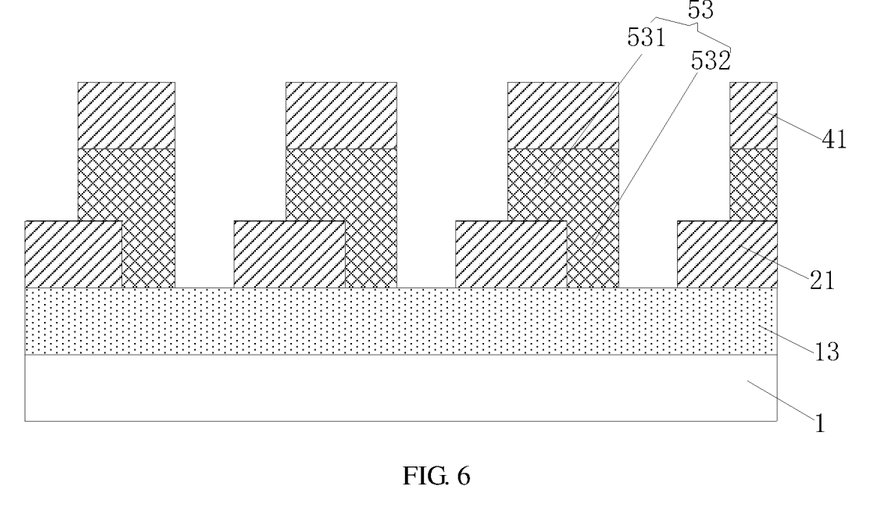

As shown in FIG. 6, the first dielectric layer is patterned 51 based on the second mask patterns 41 and the second mask openings 42 to form inverted L-shaped patterns 53, the inverted L-shaped pattern 53 comprising an inverted L-shaped top portion 531 and an inverted L-shaped side portion 532. Since the projection of the second mask patterns 41 on the substrate 1 is at least partially overlapped with the projection of the first mask patterns 21 and the first mask openings 22 on the substrate 1, the first dielectric layer 51 is patterned through the second mask patterns 41 and the second mask openings 42, and the remaining first dielectric layer 51 is partially located on the surface of the first mask patterns 21 and partially located in the first mask openings 22, thereby forming inverted L-shaped patterns 53, with the inverted L-shaped top portions 531 located above the first mask patterns 21 and the inverted L-shaped side portions 532 located in the first mask openings 22.

Figure 7:
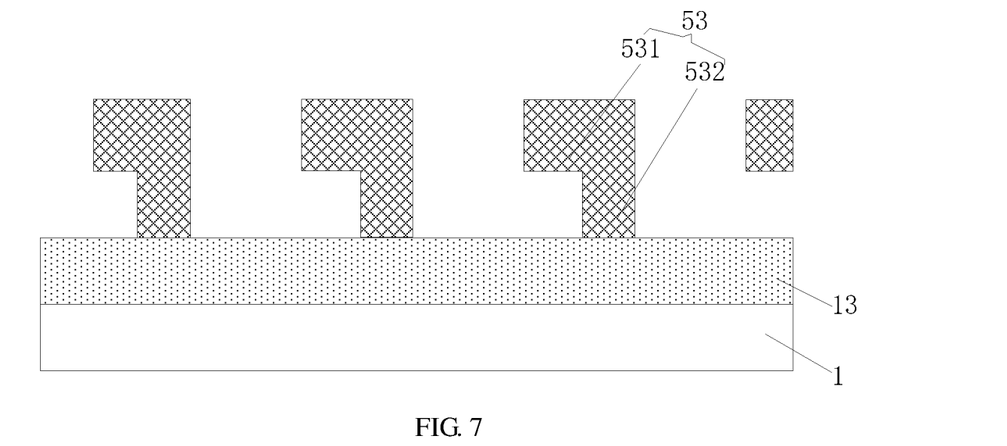
Figure 8:
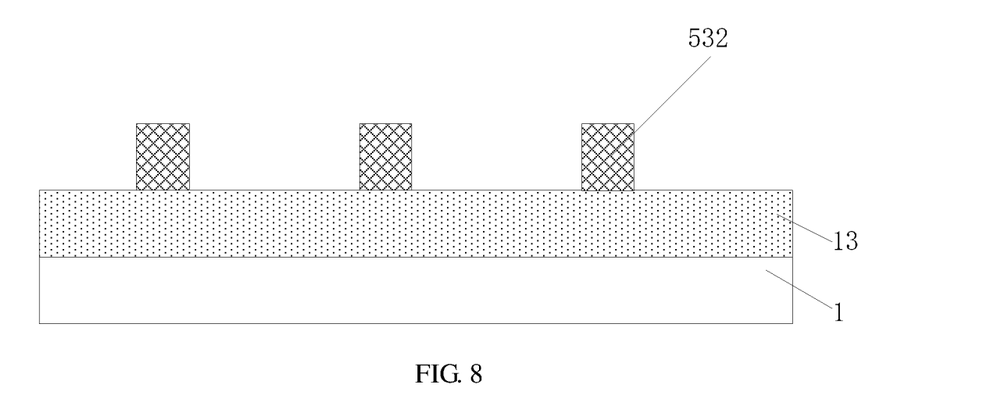
Figure 9:
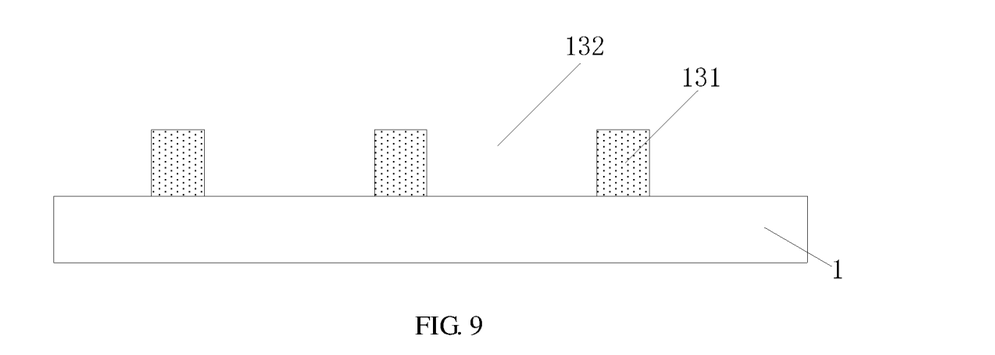
Figure 10:
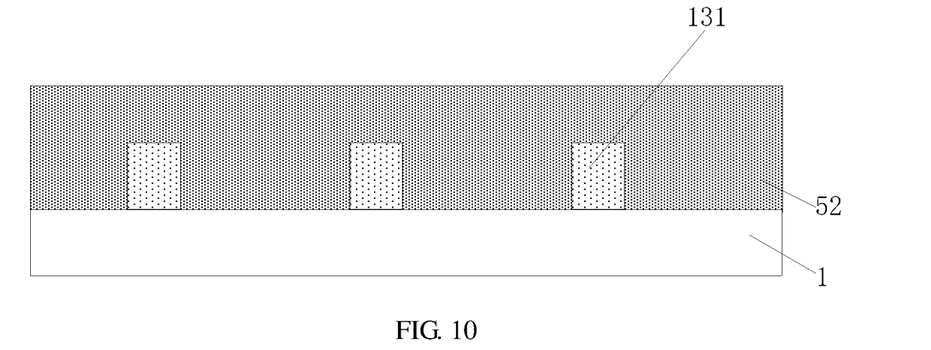

As shown in FIG. 7, the second mask patterns 41 above the inverted L-shaped top portions 531 and the first mask patterns 21 around the inverted L-shaped side portions 532 are removed. That is, the first mask patterns 21 and the second mask patterns 41 are removed, leaving the inverted L-shaped patterns 53. Specifically, a wet etching process may be used. As shown in FIGS. 7 and 8, the inverted L-shaped patterns 53 are etched to remove the inverted L-shaped top portions 531, leaving the inverted L-shaped side portions 532. Specifically, only the inverted L-shaped top portions 531 may be removed by controlling the etching time, leaving the inverted L-shaped side portions 532. The inverted L-shaped side portions 532 left are the overlapped parts of the second mask patterns 41 and the first mask openings 22. Then, the substrate 1 may be etched by using the inverted L-shaped side portions 532 to form the first patterns 11 and the first openings 12 on the substrate 1. That is, the substrate 1 may be etched by using the inverted L-shaped side portions 532 as a mask, to form the first patterns 11 and the first openings 12 on the substrate 1. The specific steps may comprise: as shown in FIG. 8, forming a first mask layer 13 on the surface of the substrate 1, and etching the first mask layer 13 by using the inverted L-shaped side portions 532 as a mask to form initial first patterns 131 and initial first openings 132. As shown in FIG. 9, the initial first patterns 131 and the initial first openings 132 are formed on the surface of the substrate 1. The substrate 1 may be etched by using the initial first patterns 131 and the initial first openings 132 to form the first patterns 11 and the first openings 12. In this case, the width of the first patterns 11 is the width of the overlapped part of the second mask patterns 41 with the first mask openings 22. By controlling the width of the overlapped part of the second mask patterns 41 with the first mask patterns 21 and the first mask openings 22, the width of the first patterns 11 and the first openings 12 formed on the substrate 1 can be accurately controlled, thereby improving the accuracy of patterning, reducing the pattern line width, and improving the degree of integration.

Optionally, the first mask patterns 21 and the second mask patterns 41 are made of the same material, so the step of removing the second mask patterns 41 above the inverted L-shaped top portions 531 and the first mask patterns 21 around the inverted L-shaped side portions 532 comprises: simultaneously removing the first mask patterns 21 and the second mask patterns 41 in a same etching step. Thus, the process steps can be simplified.

Further, the step of forming the first patterns 11 and the first openings 12 may be repeated N times on the substrate 1, wherein N is a positive integer greater than or equal to 2, so that a semiconductor structure with a smaller line width and a higher degree of integration may be obtained.

FIGS. 9-14 are cross-sectional views of a semiconductor structure with a smaller line width, obtained by repeating the above-mentioned patterning process, according to a specific embodiment of the present disclosure.

The step of etching the substrate 1 to form the first patterns 11 and the first openings 12 based on the first mask patterns 21, the first mask openings 22, the second mask patterns 41, and the second mask openings 42 comprises: forming initial first patterns 131 and initial first openings 132 on the first mask layer 13 based on the first mask patterns 21, the first mask openings 22, the second mask patterns 41, and the second mask openings 42; forming a second dielectric layer 52 filling the initial first openings 132; forming initial second patterns 621 and initial second openings 622 on the second dielectric layer 52; and forming the first patterns 11 and the first openings 12 on the substrate 1 based on the initial first patterns 131, the initial first openings 132, the initial second patterns 621 and the initial second openings 622.

The step of forming initial second patterns 621 and initial second openings 622 on the second dielectric layer 52 may comprise: forming third mask patterns and third mask openings on the second dielectric layer 52, the third mask opening being located between the adjacent third mask patterns; forming fourth mask patterns and fourth mask openings on the third mask patterns and the third mask openings, the fourth mask opening being located between the adjacent fourth mask patterns, wherein the projection of the fourth mask patterns on the substrate 1 is at least partially overlapped with the projection of the third mask patterns and the third mask openings on the substrate 1, and the projection of the fourth mask openings on the substrate 1 is at least partially overlapped with the projection of the third mask patterns and the third mask openings on the substrate 1; and forming initial second patterns 621 and initial second openings 622 on the second dielectric layer 52 based on the third mask patterns, the third mask openings, the fourth mask patterns and the fourth mask openings.

The third mask patterns, the third mask openings, the fourth mask patterns and the fourth mask openings are formed in the same way as the first mask patterns 21, the first mask openings 22, the second mask patterns 41 and the second mask openings 42.

Figure 11:
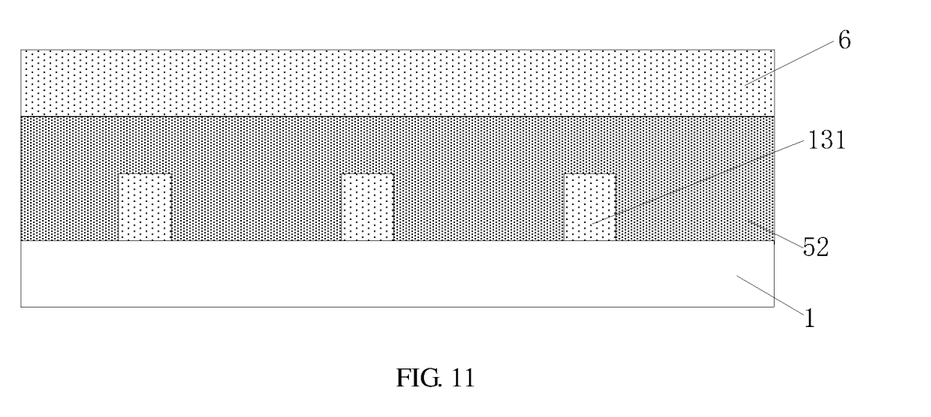

Specifically, as shown in FIG. 11, a second mask layer 6 is formed on the surface of the second dielectric layer 52, and third mask patterns layer and a third photoresist layer are formed on the surface of the second mask layer 6. The third photoresist layer is patterned, and the patterned third photoresist layer is used as a mask to etch the third mask patterns layer to form third mask patterns and third mask openings. The third mask opening is formed between the adjacent third mask patterns.

A third dielectric layer is formed on the surface of the third mask patterns. The third dielectric layer covers the surface of the third mask patterns and fills the third mask openings. fourth mask patterns layer and a fourth photoresist layer are formed on the surface of the third dielectric layer. The fourth photoresist layer is patterned, and the patterned fourth photoresist layer is used as a mask to etch the fourth mask patterns layer to form fourth mask patterns and second mask openings. The fourth mask opening is formed between the adjacent fourth mask patterns.

Figure 12:
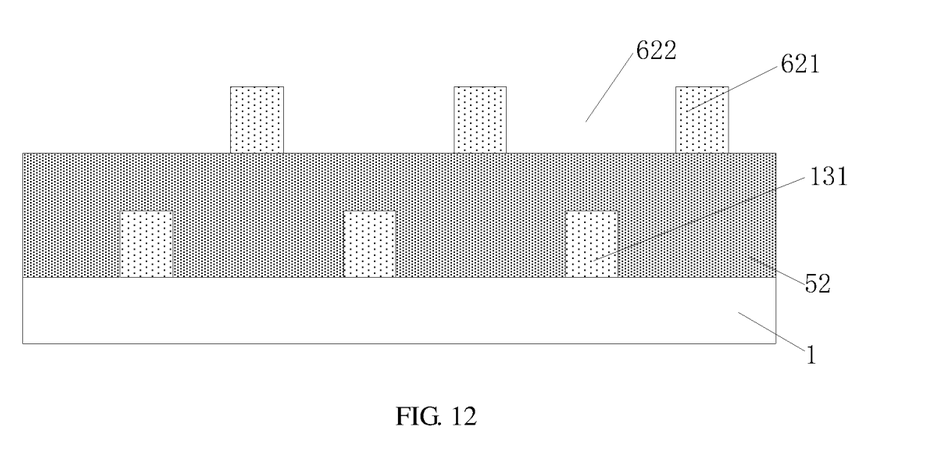

As shown in FIG. 12, the second mask layer 6 is patterned based on the third mask patterns, the third mask openings, the fourth mask patterns and the fourth mask openings, to form initial second patterns 621 and initial second openings 622.

The step of patterning the third dielectric layer based on the third mask patterns, the third mask openings, the fourth mask patterns and the fourth mask openings is the same as the step of patterning the first dielectric layer 51 based on the first mask patterns 21, the first mask openings 22, the second mask patterns 41 and the second mask openings 42.

Specifically, the third dielectric layer is patterned based on the fourth mask patterns and the fourth mask openings to form inverted L-shaped patterns, and then the third mask patterns and the fourth mask patterns are removed; the inverted L-shaped top portions are removed and the inverted L-shaped side portions are left, and the inverted L-shaped side portions are used as a mask to pattern the third dielectric layer; and then the patterned third dielectric layer is used as a mask to etch the second mask layer 6 to form initial second patterns 621 and initial second openings 622. Optionally, in order to save the cost, the third mask patterns, the third mask openings, the fourth mask patterns, and the fourth mask openings may be formed by using a same photomask. Further, the first mask patterns, the first mask openings, the second mask patterns, the second mask openings, the third mask patterns, the third mask openings, the fourth mask patterns and the fourth mask openings may all be formed by using a same photomask.

Figure 13:
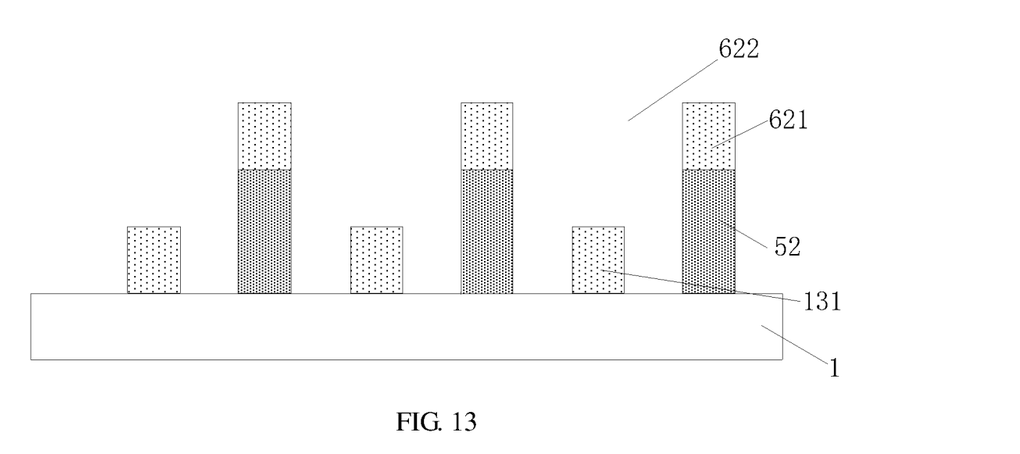
Figure 14:
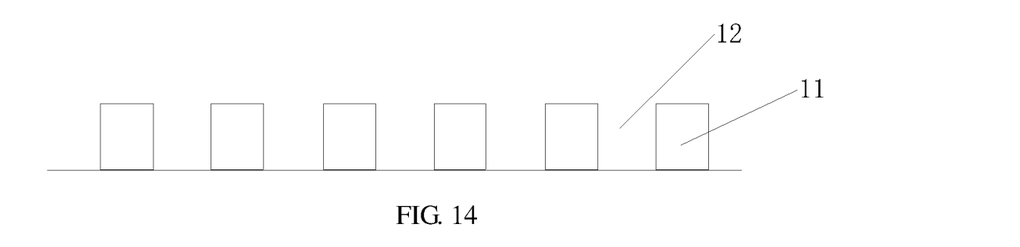

As shown in FIGS. 13 and 14, the second dielectric layer 52 is etched by using the initial second patterns 621 and the initial second openings 622 to form a patterned second dielectric layer 52, and first patterns 11 and first openings 12 are formed in the substrate 1 by using the initial first patterns 131, the initial first openings 132 and the patterned second dielectric layer 52.

As shown in FIG. 13, the projection of the initial second patterns 621 on the substrate 1 is within the projection of the initial first openings 132 on the substrate 1; the projection of the initial first patterns 131 on the substrate 1 is within the projection of the initial second openings 622 on the substrate 1. Thus, the substrate 1 may be etched by using the first mask patterns 21 and the second mask patterns 41 as mask patterns to form the first patterns 11 and the first openings 12 on the substrate 1, Therefore, the line width of the first patterns 11 and the size of the first openings 12 are made small, so as to reduce the first openings 12 and further reduce the size of the semiconductor device.

The step of forming the first patterns 11 and the first openings 12 in the above embodiment may be repeated N times on the substrate 1, wherein N is a positive integer greater than or equal to 2, so that a pattern with a smaller line width may be obtained.

Optionally, the line width and the number of repetitions are determined according to the size of the overlapped part of the projections of the second mask patterns 41 and the first mask openings 22 on the substrate 1, wherein the size of the overlapped part of the projections of the second mask patterns 41 and the first mask openings 22 on the substrate 1 is the line width. The higher the number of repetitions, the smaller the line width of the final semiconductor structure, and the higher the patterning accuracy.

Those skilled in the art will readily think of other implementations of the present disclosure by considering the specification and practicing the disclosure disclosed herein. The present disclosure is intended to encompass any variations, uses, or adaptive changes of the present disclosure.

These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the appended claims.

It should be understood that the present disclosure is not limited to the precise structures that have been described above and shown in the drawings, and various modifications and changes may be made without departing from its scope. The scope of the present disclosure is defined only by the appended claims.

INDUSTRIAL APPLICABILITY

The present disclosure provides a manufacturing method for semiconductor structure and a semiconductor structure. In the method, first mask patterns, first mask openings, second mask patterns and second mask openings are formed, the projection of the second mask patterns on the substrate is at least to partially overlapped with the projection of the first mask patterns and the first mask openings on the substrate, and the projection of the second mask openings on the substrate is at least partially overlapped with the projection of the first mask patterns and the first mask openings on the substrate. Thus, through overlapped imaging, the overlapped part of the first mask patterns and the second mask openings may be controlled to control the key line width of the pattern, so a pattern with a smaller line width may be obtained. The accurate control of the line width and the degree of integration of the semiconductor structure during the semiconductor manufacturing process can be improved.

The invention claimed is:

1. A manufacturing method for a semiconductor structure, comprising:
   providing a substrate;
   forming first mask patterns and first mask openings on the substrate, the first mask openings being located between adjacent first mask patterns of the first mask patterns;
   forming second mask patterns and second mask openings on the first mask patterns and the first mask openings, the second mask openings being located between adjacent second mask patterns of the second mask patterns, wherein a projection of the second mask patterns on the substrate is at least partially overlapped with a projection of the first mask patterns and the first mask openings on the substrate, and a projection of the second mask openings on the substrate is at least partially overlapped with the projection of the first mask patterns and the first mask openings on the substrate;
   forming first patterns and first openings on the substrate based on the first mask patterns, the first mask openings, the second mask patterns and the second mask openings; and
   forming a first dielectric layer on the first mask patterns and the first mask openings, the first dielectric layer filling the first mask openings, the second mask patterns and the second mask openings being located on the first dielectric layer.

2. The manufacturing method for the semiconductor structure according to claim 1, comprising:

forming the first mask patterns, the first mask openings, the second mask patterns and the second mask openings by using a same photomask.

3. A semiconductor structure, formed by the manufacturing method according to claim 1.

4. The manufacturing method for the semiconductor structure according to claim 1, comprising:
   patterning the first dielectric layer based on the second mask patterns and the second mask openings to form inverted L-shaped patterns, each of the inverted L-shaped patterns comprising an inverted L-shaped top portion and an inverted L-shaped side portion.

5. The manufacturing method for the semiconductor structure according to claim 4, wherein the forming first patterns and first openings on the substrate based on the first mask patterns, the first mask openings, the second mask patterns and the second mask openings comprises:
   removing the second mask patterns above the inverted L-shaped top portions and the first mask patterns around the inverted L-shaped side portions;
   removing the inverted L-shaped top portions, and leaving the inverted L-shaped side portions; and
   etching the substrate by using the inverted L-shaped side portions to form the first patterns and the first openings on the substrate.

6. The manufacturing method for the semiconductor structure according to claim 5, wherein,
   the first mask patterns and the second mask patterns are made of a same material; and
   the removing the second mask patterns above the inverted L-shaped top portions and the first mask patterns around the inverted L-shaped side portions comprises:
   simultaneously removing the first mask patterns and the second mask patterns in a same etching step.

7. The manufacturing method for the semiconductor structure according to claim 1, further comprising:
   forming a first mask layer on the substrate; and
   the forming first patterns and first openings on the substrate based on the first mask patterns, the first mask openings, the second mask patterns and the second mask openings comprises:
   forming initial first patterns and initial first openings on the first mask layer based on the first mask patterns, the first mask openings, the second mask patterns and the second mask openings;
   forming a second dielectric layer filling the initial first openings;
   forming initial second patterns and initial second openings on the second dielectric layer; and
   forming the first patterns and the first openings on the substrate based on the initial first patterns, the initial first openings, the initial second patterns and the initial second openings.

8. The manufacturing method for the semiconductor structure according to claim 7, wherein the forming initial second patterns and initial second openings on the second dielectric layer comprises:
   forming third mask patterns and third mask openings on the second dielectric layer, the third mask openings being located between adjacent third mask patterns of the third mask patterns;
   forming fourth mask patterns and fourth mask openings on the third mask patterns and the third mask openings, the fourth mask openings being located between adjacent fourth mask patterns of the fourth mask patterns, wherein a projection of the fourth mask patterns on the substrate is at least partially overlapped with a projection of the third mask patterns and the third mask openings on the substrate, and a projection of the fourth mask openings on the substrate is at least partially overlapped with the projection of the third mask patterns and the third mask openings on the substrate; and forming the initial second patterns and the initial second openings on the second dielectric layer based on the third mask patterns, the third mask openings, the fourth mask patterns and the fourth mask openings.

9. The manufacturing method for the semiconductor structure according to claim 8, comprising:

forming the third mask patterns, the third mask openings, the fourth mask patterns and the fourth mask openings by using a same photomask.

10. The manufacturing method for the semiconductor structure according to claim 8, comprising:

forming the first mask patterns, the first mask openings, the second mask patterns, the second mask openings, the third mask patterns, the third mask openings, the fourth mask patterns and the fourth mask openings by using a same photomask.

11. The manufacturing method for the semiconductor structure according to claim 7, wherein, a projection of the initial second patterns on the substrate is within a projection of the initial first openings on the substrate; and a projection of the initial first patterns on the substrate is within a projection of the initial second openings on the substrate.

12. The manufacturing method for the semiconductor structure according to claim 1, further comprising:

repeating the forming first patterns and first openings N times on the substrate, wherein N is a positive integer greater than or equal to 2.

13. The manufacturing method for the semiconductor structure according to claim 12, comprising:

determining a number of repetitions, according to a size of an overlapped part of the projections of the second mask patterns and the first mask openings on the substrate.

14. The manufacturing method for the semiconductor structure according to claim 1, further comprising:

forming a first mask layer on the substrate; and the forming first patterns and first openings on the substrate based on the first mask patterns, the first mask openings, the second mask patterns and the second mask openings comprises:

forming initial first patterns and initial first openings on the first mask layer based on the first mask patterns, the first mask openings, the second mask patterns and the second mask openings; and forming the first patterns and the first openings on the substrate by using the initial first patterns and the initial first openings.

15. The manufacturing method for the semiconductor structure according to claim 14, further comprising: repeating the forming the first patterns and first openings N times on the substrate, wherein N is a positive integer greater than or equal to 2.

16. The manufacturing method for the semiconductor structure according to claim 15, comprising:

determining a number of repetitions, according to a size of an overlapped part of the projections of the second mask patterns and the first mask openings on the substrate.

17. A manufacturing method for a semiconductor structure, comprising:

providing a substrate;

forming first mask patterns and first mask openings on the substrate, the first mask openings being located between adjacent first mask patterns of the first mask patterns;

forming second mask patterns and second mask openings on the first mask patterns and the first mask openings, the second mask openings being located between adjacent second mask patterns of the second mask patterns, wherein a projection of the second mask patterns on the substrate is at least partially overlapped with a projection of the first mask patterns and the first mask openings on the substrate, and a projection of the second mask openings on the substrate is at least partially overlapped with the projection of the first mask patterns and the first mask openings on the substrate; and forming first patterns and first openings on the substrate based on the first mask patterns, the first mask openings, the second mask patterns and the second mask openings;

wherein the manufacturing method for the semiconductor structure further comprises:

forming a first mask layer on the substrate; and the forming first patterns and first openings on the substrate based on the first mask patterns, the first mask openings, the second mask patterns and the second mask openings comprises:

forming initial first patterns and initial first openings on the first mask layer based on the first mask patterns, the first mask openings, the second mask patterns and the second mask openings;

forming a second dielectric layer filling the initial first openings;

forming initial second patterns and initial second openings on the second dielectric layer; and forming the first patterns and the first openings on the substrate based on the initial first patterns, the initial first openings, the initial second patterns and the initial second openings.

* * * * *